United States Patent
Zha

(10) Patent No.: US 8,327,921 B2
(45) Date of Patent: Dec. 11, 2012

(54) HEAT DISSIPATING DEVICE AND FIN ASSEMBLY THEREOF

(75) Inventor: Xin-Xiang Zha, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 810 days.

(21) Appl. No.: 12/483,229

(22) Filed: Jun. 11, 2009

(65) Prior Publication Data

US 2010/0025014 A1 Feb. 4, 2010

(30) Foreign Application Priority Data

Jul. 30, 2008 (CN) .......................... 2008 1 0303205

(51) Int. Cl.
*F28D 15/02* (2006.01)
*F28F 1/30* (2006.01)

(52) U.S. Cl. ................................. 165/80.3; 165/104.21

(58) Field of Classification Search ................ 165/80.3, 165/104.21, 104.26, 104.33; 361/697, 700, 361/703
See application file for complete search history.

(56) References Cited

U.S. PATENT DOCUMENTS

| | | | |
|---|---|---|---|
| 2005/0056398 A1* | 3/2005 | Lai ................................ | 165/80.3 |
| 2006/0181848 A1* | 8/2006 | Kiley et al. .................... | 361/697 |

* cited by examiner

*Primary Examiner* — Teresa Walberg
(74) *Attorney, Agent, or Firm* — Altis Law Group, Inc.

(57) ABSTRACT

A fin assembly includes a plurality of fins interconnected together. Each of the fins includes a main body defining a plurality of openings and a plurality of locking units formed on the main body beside the plurality of openings, respectively. Each of the locking units includes an extension tab, a locking tab and a connecting tab. An engaging hole is defined in the extension tab. The locking tab forms an elastically deformable finger thereon. A locking tab of a fin is received in a corresponding opening of an adjacent fin. A free end of the locking tab of the fin resists on a connecting tab of the adjacent fin. A finger of the fin is engaged into an engaging hole of the adjacent fin.

10 Claims, 6 Drawing Sheets

US 8,327,921 B2

HEAT DISSIPATING DEVICE AND FIN ASSEMBLY THEREOF

BACKGROUND

1. Technical Field

The present disclosure relates to heat dissipating devices, more particularly to a heat dissipating device with a plurality of interlocked fins that are easily and securely interlocked.

2. Description of Related Art

It is well known that during operation of a computer, electronic component thereof such as a central processing unit (CPU) generates large amounts of heat. The generated heat must be quickly removed from the electronic component to prevent it from becoming unstable or being damaged. Generally, a heat dissipating device is attached to the electronic component for a cooling purpose. A typical heat dissipating device includes a base plate and a plurality of fins extending from the base plate. The base plate is attached to the electronic component to absorb heat from the electronic component, and the heat absorbed by the base plate is then dissipated to ambient air via the fins. However, the fins are easily disengaged from the adjacent fins when the assembled fins are subject to mechanical shocks.

Therefore, it is desirable to provide a heat dissipating device which has a plurality of fins securely interlocked with each other.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
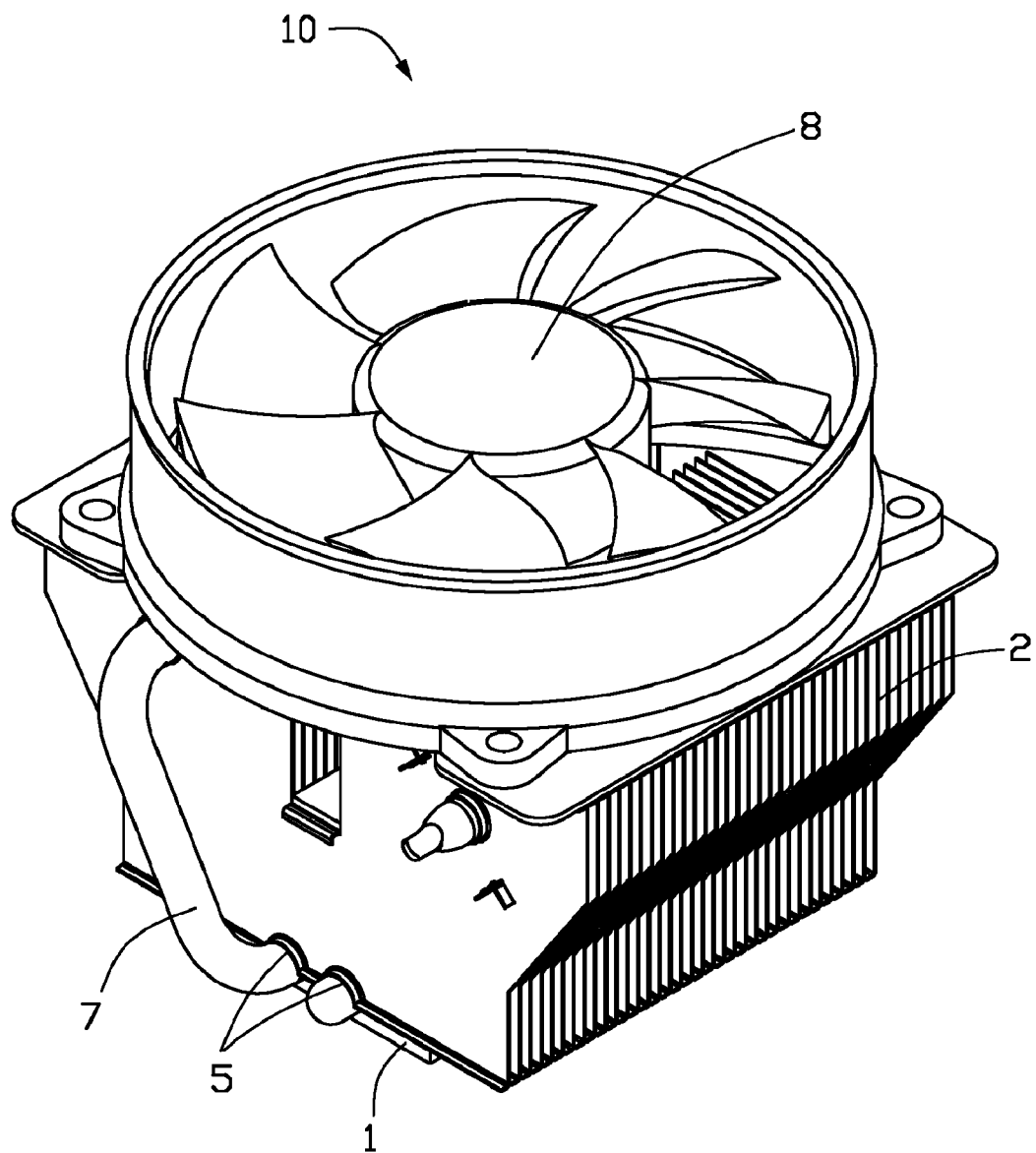
FIG. 1 is an assembled, isometric view of a heat dissipating device in accordance with an exemplary embodiment of the present disclosure.
Figure 2:
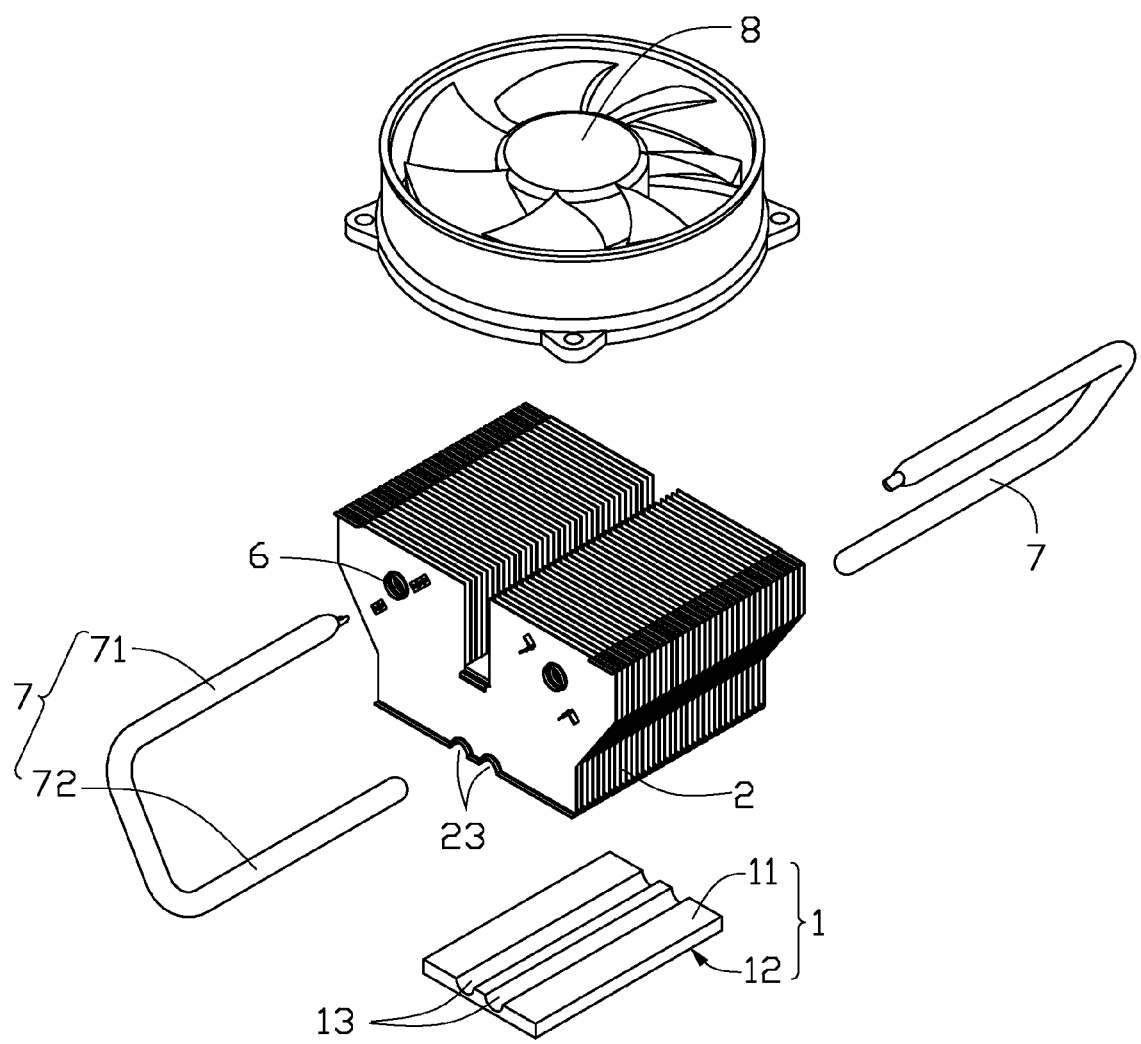
FIG. 2 is an exploded, isometric view of the heat dissipating device of FIG. 1.
Figure 3:
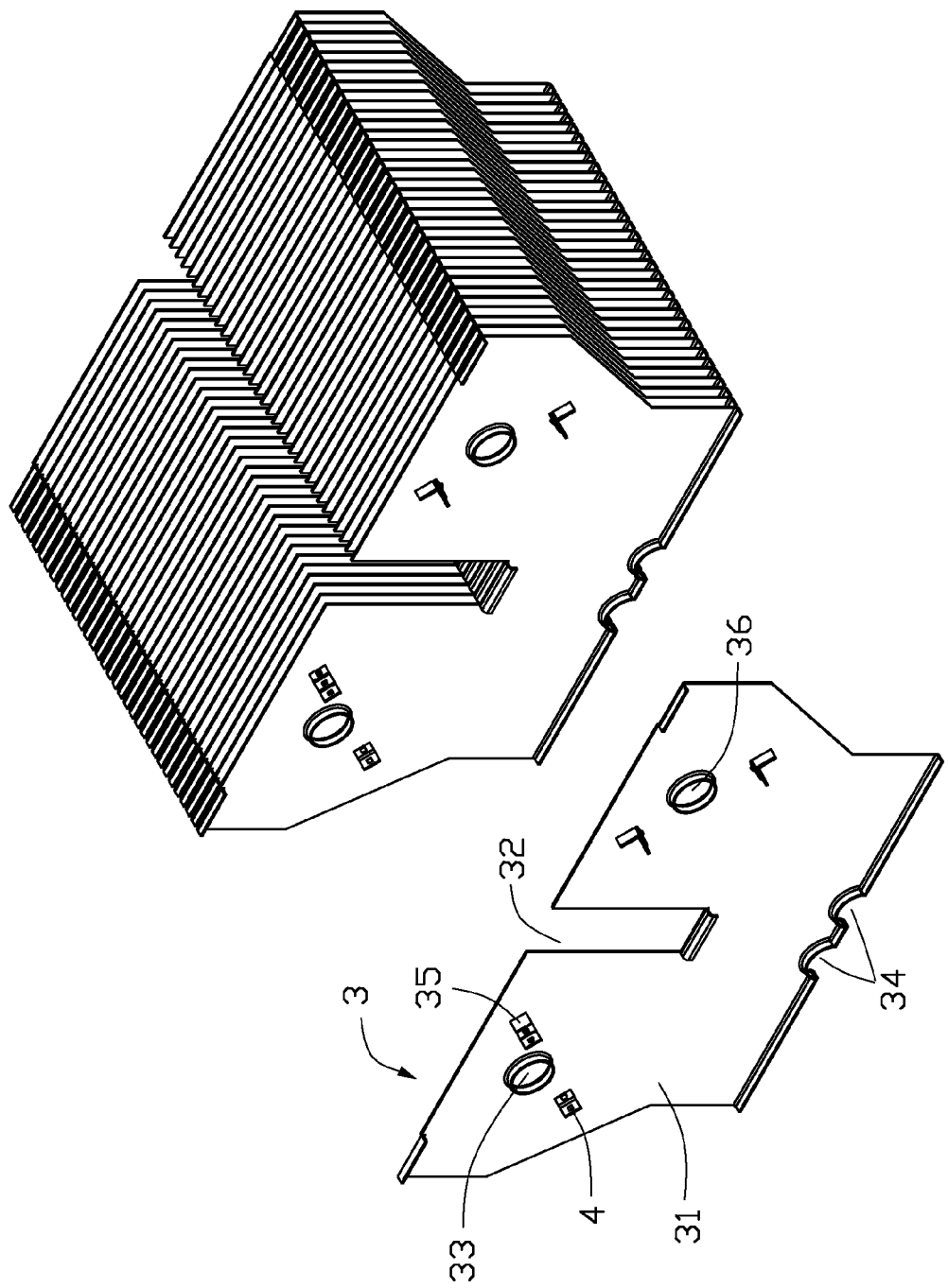
FIG. 3 is an exploded view of a fin assembly of the heat dissipating device of FIG. 1.

Referring to FIGS. 1-3, a heat dissipating device 10 includes a base plate 1, a fin assembly 2, two heat pipes 7 and a heat dissipating fan 8. The base plate 1 is located at a bottom of the heat dissipating device 10 and defines two semi-circular first grooves 13 in a top surface 11 thereof. A bottom surface 12 of the base plate 1 is used for thermally contacting with a heat source such as a CPU for absorbing heat therefrom.

The fin assembly 2 is located on the base plate 1 and includes a plurality of fins 3 stacked together along a direction parallel to the first grooves 13 of the base plate 1. Each fin 3 defines two semi-circular cutouts 34 at a bottom side thereof. All the cutouts 34 of the fins 3 cooperatively form two semi-circular second grooves 23 corresponding to the two first grooves 11 of the base plate 1. Each second groove 23 of the fin assembly 2 and a corresponding first groove 11 of the base plate 1 cooperatively define a circular first receiving channel 5.

The fin 3 includes a main body 31 and a plurality of locking units 4 formed on the main body 31. The main body 31 defines an elongated slot 32 through a middle of a top portion of the main body 31. Two receiving holes 33, 36 are defined in the main body 31 and symmetrically located at two opposite sides of the slot 32. The receiving holes 33, 36 of the fins 3 cooperatively define two circular second receiving channels 6.

Figure 4:
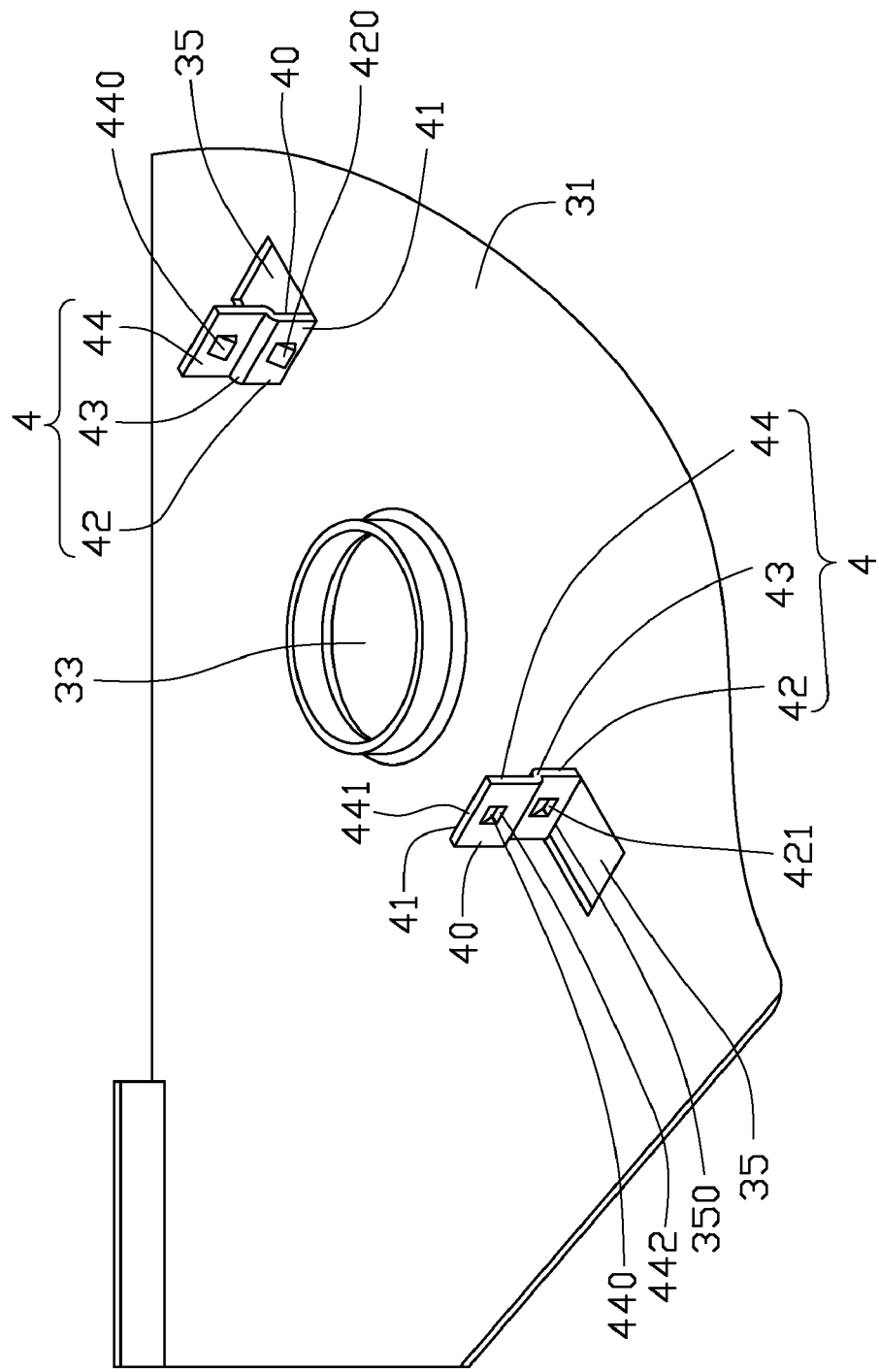
FIG. 4 is an enlarged view showing partially a fin of the fin assembly of FIG. 3.

Referring also to FIG. 4, two opposite locking units 4 are symmetrically located near each receiving hole 33 (36). Each locking unit 4 is punched perpendicularly forwardly from the main body 31 of the fin 3, thereby defining a rectangular opening 35 in the main body 31 of the fin 3 corresponding to the locking unit 4. The opening 35 has a side edge 350 immediately adjacent to the locking unit 4. Thus, there are two opposite openings 35 symmetrically located beside a corresponding receiving hole 33 (36), with the side edges 350 of the two opposite openings 35 being located near the corresponding receiving hole 33 (36).

The locking unit 4 has an inner surface 40 adjacent to the rectangular opening 35 and an outer surface 41 opposite the inner surface 40. The locking unit 4 includes an extension tab 42, a locking tab 44 in front of the extension tab 42, and a connecting tab 43 connected between the extension tab 42 and the locking tab 44. The locking tab 44 is parallel to the extension tab 42 and offsets from the extension tab 42. The connecting tab 43 is perpendicularly connected between the extension tab 42 and the locking tab 44.

The extension tab 42 extends perpendicularly and forwardly from the side edge 350 of the rectangular opening 35. A sloping clip 420 is formed at a center of the extension tab 42 by stamping the extension tab 42 from the inner surface 40 towards the outer surface 41 of the locking unit 4, thereby defining a rectangular engaging hole 421 in the extension tab 42 corresponding to the sloping clip 420. The extension tab 42 has a connecting edge 422 (FIG. 6) at a front side of the engaging hole 421 and a resisting edge 423 at a rear side of the engaging hole 421 opposite to the connecting edge 422. The sloping clip 420 extends rearwards and inwardly from the connecting edge 422 toward the corresponding receiving hole 33 (36).

The connecting tab 43 is slantwise to the main body 31 and extends from a front end of the extension tab 42 toward the rectangular opening 35. The locking tab 44 extends perpendicularly and forwardly from an end of the connecting tab 43. An elastically deformable finger 440 is formed at a center of the locking tab 44 by stamping the locking tab 44 from the inner surface 40 to the outer surface 41 of the locking unit 4, thereby defining a punched hole 442 in the locking tab 44 corresponding to the finger 440. The deformable finger 440 of the locking tab 44 is oriented parallel to the sloping clip 420 of the extension tab 42. The punched hole 442 provides a space for the finger 440 to move therein when the finger 440 is elastically deformed.

Figure 5:
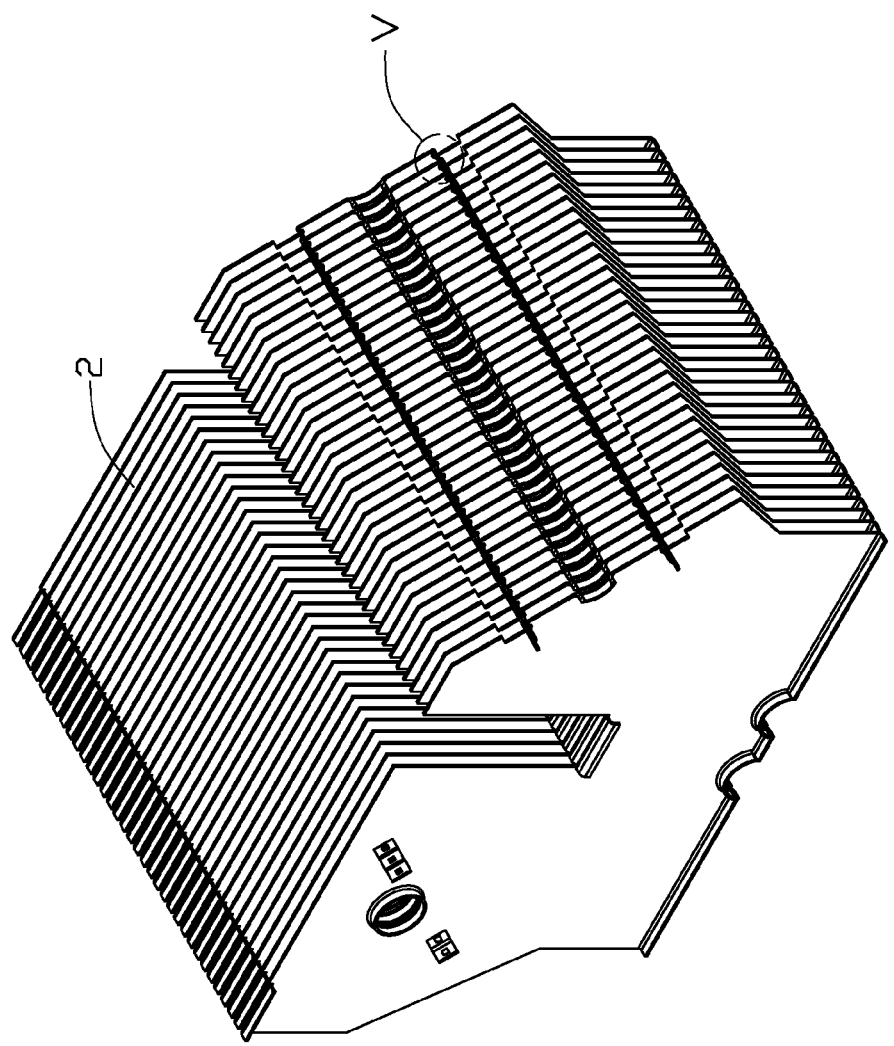
FIG. 5 is an assembled isometric view of the fin assembly of FIG. 3, with a portion thereof being cut away.
Figure 6:
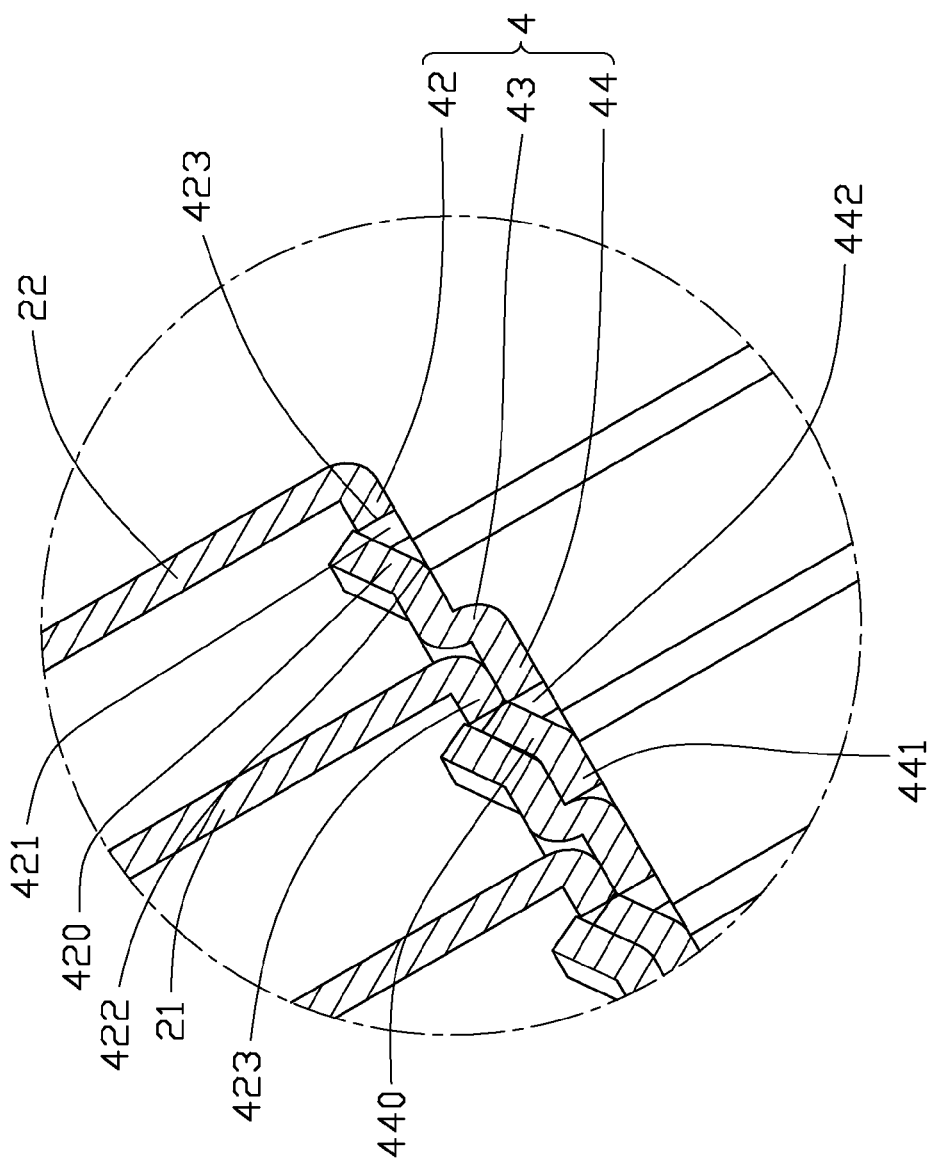
FIG. 6 shows an enlarged view of a circle portion VI of FIG. 5.

Referring also to FIGS. 5-6, in assembly of the fin assembly 2, a front fin 21 is held in a vertical direction, and a rear fin 22 is placed parallel to the front fin 21, with the locking tabs 44 of the rear fin 22 being aligned with the rectangular openings 35 of the front fin 21, respectively. The rear fin 22 is then pushed toward the front fin 21 to cause the locking tabs 44 of the rear fin 22 to extend into the corresponding openings 35 of the front fin 21. Thus, the fingers 440 formed on the locking tabs 44 of the rear fin 22 are brought into engagement with the corresponding extension tabs 42 of the front fin 21 to cause the fingers 440 of the rear fin 22 to elastically deform toward the punched holes 442 of the locking tabs 44 of the rear fin 22. Once the fingers 440 of the rear fin 22 arrive at the engaging holes 421 of the extension tabs 42 of the front fin 21, the fingers 440 of the rear fin 22 elastically restore back to their original shape. The fingers 440 of the rear fin 22 are engaged into the engaging holes 421 of the front fin 21 and resist against the resisting edges 423 of the engaging holes 421. In addition, the fingers 440 of the rear fin 22 rest on the sloping fingers 420 of the front fin 21. At the same time, outer free ends 441 of the locking tabs 44 of the rear fin 22 resist on the connecting tabs 43 of the front fin 21 and the locking tabs 44 of the rear fin 22 contact with the extension tabs 42 of the front fin 21. Then, other fins 3 are sequentially assembled to the rear fin 22 in a similar fashion for stacking the fins 3 into an assembly. Thus, the fins 3 are connected together to form the fin assembly 2.

Each heat pipe 7 is U-shaped and includes a condenser section 71 and an evaporator section 72. The condenser section 71 is received in a corresponding second receiving channel 6 of the fin assembly 2. The evaporator section 72 is received in a corresponding first receiving channel 5.

The heat dissipating fan 8 is fixed on the fin assembly 2 and generates an airflow flowing through the fin assembly 2 to take away heat transferred to the fin assembly 2 from the heat source.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A fin assembly comprising:
    a plurality of fins interconnected together, each of the fins comprising:
    a main body defining a plurality of openings therein; and
    a plurality of locking units formed on the main body beside the plurality of openings, respectively, each of the locking units comprising an extension tab connected with the main body, a locking tab in front of the extension tab, and a connecting tab connected between the extension tab and the locking tab, an engaging hole being defined in the extension tab, the locking tab forming a deformable finger thereon;
    wherein the locking unit of a fin extends through a corresponding opening of the plurality of openings of an adjacent fin, an outer free end of the locking tab of the fin rests on the connecting tab of the adjacent fin, the finger of the fin is engaged into the engaging hole of the adjacent fin; and
    wherein the locking unit has an inner surface adjacent to the opening and an outer surface opposite to the inner surface, a clip being formed on the extension tab by stamping the extension tab from the inner surface towards the outer surface of the locking unit thereby defining the engaging hole in the extension tab.

2. The fin assembly as claimed in claim 1, wherein the clip of the extension tab is parallel to the finger of the locking tab, the finger of the locking unit of the fin resting on the clip of the locking unit of the adjacent fin.

3. The fin assembly as claimed in claim 1, wherein the finger is formed by stamping the locking tab from the inner surface towards the outer surface of the locking unit thereby defining a hole in the locking tab for providing a space for the finger to move therein when the finger is elastically deformed.

4. The fin assembly as claimed in claim 1, wherein a slot is defined through a middle of a top portion of the main body, two holes being defined in the main body and symmetrically located at two opposite sides of the slot, condenser portions of two heat pipes being received in the two holes.

5. A heat dissipating device comprising:
    a base plate;
    a fin assembly mounted on the base plate and comprising a plurality of fins interlocked together; and
    a heat dissipating fan mounted on the fin assembly and generating an airflow flowing through the fin assembly;
    wherein each of the fins comprises:
    a main body defining a plurality of openings therein; and
    a plurality of locking units formed on the main body beside the plurality of openings, respectively, each of the locking units comprising an extension tab connected with the main body, a locking tab in front of the extension tab, and a connecting tab connected between the extension tab and the locking tab, an engaging hole being defined in the extension tab, the locking tab forming a deformable finger thereon;
    wherein the locking unit of a fin extends through a corresponding opening of the plurality of openings of an adjacent fin, an outer free end of the locking tab of the fin rests on the connecting tab of the adjacent fin, the finger of the fin is engaged into the engaging hole of the adjacent fin; and
    wherein the locking unit has an inner surface adjacent to the opening and an outer surface opposite to the inner surface, a clip being formed on the extension tab by stamping the extension tab from the inner surface towards the outer surface of the locking unit thereby defining the engaging hole in the extension tab.

6. The heat dissipating device as claimed in claim 5, wherein the clip of the extension tab is parallel to the finger of the locking tab, the finger of the locking unit of the fin resting on the clip of the locking unit of the adjacent fin.

7. The fin assembly as claimed in claim 5, wherein the finger is formed by stamping the locking tab from the inner surface towards the outer surface of the locking unit thereby defining a hole in the locking tab for providing a space for the finger to move therein when the finger is elastically deformed.

8. The heat dissipating device as claimed in claim 5 further comprising at least one heat pipe, the at least one heat pipe having a condenser section and an evaporator section.

9. The heat dissipating device as claimed in claim 8, wherein the base plate defines at least one semi-circular first groove at a top side thereof, the fin assembly defining at least one semi-circular second groove at a bottom side thereof, the first groove and the second groove cooperatively defining a circular first receiving hole, the evaporator section of the at least one heat pipe being received in the first receiving hole.

10. The heat dissipating device as claimed in claim 8, wherein the main body of the fin defines a slot through a middle of a top portion of the main body, two receiving holes being defined in the main body of the fin and located at two opposite sides of the slot, the receiving holes of the fins cooperatively defining at least a second receiving channel, the condenser section of the at least one heat pipe being received in the at least a second receiving channel.

* * * * *